United States Patent
Shikano

(10) Patent No.: US 7,855,464 B2
(45) Date of Patent: Dec. 21, 2010

(54) SEMICONDUCTOR DEVICE HAVING A SEMICONDUCTOR CHIP AND RESIN SEALING PORTION

(75) Inventor: Taketoshi Shikano, Chiyoda-ku (JP)

(73) Assignee: Mitsubishi Electric Corporation, Tokyo (JP)

(*) Notice: Subject to any disclaimer, the term of this patent is extended or adjusted under 35 U.S.C. 154(b) by 2 days.

(21) Appl. No.: 12/266,718

(22) Filed: Nov. 7, 2008

(65) Prior Publication Data
US 2010/0007026 A1    Jan. 14, 2010

(30) Foreign Application Priority Data
Jul. 10, 2008    (JP) .............................. 2008-180154

(51) Int. Cl.
H01L 23/48    (2006.01)
H01L 23/52    (2006.01)
H01L 29/40    (2006.01)

(52) U.S. Cl. ................. 257/786; 257/773; 257/787; 257/E21.499; 257/E23.011

(58) Field of Classification Search ................. 257/678, 257/730, 731, 733, 782, 783, 784, 786, 787, 257/E31.117, E31.118, E51.02, E21.499, 257/E23.011
See application file for complete search history.

(56) References Cited

U.S. PATENT DOCUMENTS

2002/0043708 A1    4/2002    Muto et al.
2004/0070066 A1    4/2004    Ogawa
2006/0261493 A1*   11/2006   Boon .......................... 257/778
2007/0257351 A1    11/2007   Lee et al.
2009/0051031 A1*   2/2009    Lai et al. ..................... 257/738

FOREIGN PATENT DOCUMENTS

| JP | 62-142338 | 6/1987 |
| JP | 64-84650 | 3/1989 |
| JP | 1-281759 | 11/1989 |
| JP | 10-116962 | 5/1998 |
| JP | 11-168168 | 6/1999 |
| JP | 11-214600 | 8/1999 |
| JP | 2003-7966 | 1/2003 |
| JP | 2003-133508 | 5/2003 |
| JP | 2006-319084 | 11/2006 |

OTHER PUBLICATIONS

Office Action issued Aug. 13, 2010, in German Application No. DE 10 2009 011 233.2-33, filed Mar. 2, 2009 (with English language translation) 10 pages.

* cited by examiner

Primary Examiner—Davienne Monbleau
Assistant Examiner—Dilinh P Nguyen
(74) Attorney, Agent, or Firm—Oblon, Spivak, McClelland, Maier & Neustadt, L.L.P.

(57) ABSTRACT

A semiconductor chip has a main surface. A conductive portion is provided on the main surface and made from a material having conductivity and malleability. A sealing resin portion has a surface facing the main surface. An electrode is provided on the conductive portion and passes through the sealing resin portion between the conductive portion and the surface. As a result, there is provided a semiconductor device that can be downsized.

18 Claims, 7 Drawing Sheets

SEMICONDUCTOR DEVICE HAVING A SEMICONDUCTOR CHIP AND RESIN SEALING PORTION

BACKGROUND OF THE INVENTION

1. Field of the Invention

The present invention relates to a semiconductor device, and in particular, to a semiconductor device having a semiconductor chip and a resin sealing portion.

2. Description of the Background Art

As a semiconductor device for use as an inverter, there is a power module having a plurality of semiconductor elements such as IGBTs (Insulated Gate Bipolar Transistors) and free wheel diodes sealed with a mold resin and an insulating sheet. For example, Japanese Patent Laying-Open No. 2006-319084 discloses such a power module.

As an art for downsizing a semiconductor device sealed with a resin, there is an art disclosed in Japanese Patent Laying-Open No. 2003-007966, for example. According to this art, a semiconductor device includes a radiation substrate, a semiconductor element provided on this radiation substrate, a plurality of main electrode plates having respective one ends electrically connected to a main electrode of the semiconductor element, and a resin package for sealing the radiation substrate, the semiconductor element and the plurality of main electrode plates with a resin. The respective other ends of the plurality of main electrode plates are exposed to the outside on the upper surface side of the resin package. The resin package is integrally formed by a molding method.

In the art disclosed in foregoing Japanese Patent Laying-Open No. 2003-007966, the electrode on the surface of the semiconductor chip and the main electrode plate are connected by wire bonding. Therefore, a region required for the wire bonding must be ensured and it is difficult to further downsize the semiconductor device. Furthermore, for example, a special die is required to allow the main electrode to project from the surface of the resin package (the upper surface side) directly on the surface of the semiconductor chip, which leads to a rise in manufacturing costs.

SUMMARY OF THE INVENTION

Therefore, an object of the present invention is to provide a semiconductor device that can further be downsized, at a relatively low cost.

A semiconductor device of the present invention has a semiconductor chip, a conductive portion, a sealing resin portion, and an electrode. The semiconductor chip has a main surface. The conductive portion is provided on the main surface and made from a material having conductivity and malleability. The sealing resin portion has a surface facing the main surface. The electrode is provided on the conductive portion and passes through the sealing resin portion between the conductive portion and the surface.

A method of manufacturing a semiconductor device of the present invention has the following steps.

First, a semiconductor chip having a main surface is prepared. A conductive portion made from a material having conductivity and malleability is formed on this main surface. The semiconductor chip having this conductive portion formed is arranged within a die. The die has an inner surface facing the main surface with a spacing therebetween, and a protruding portion protruding from the inner surface to press the conductive portion. A sealing resin portion having a surface facing the main surface and an opening passing through between the conductive portion and the surface is formed by filling the die with a resin and then removing the die.

According to the semiconductor device of the present invention, the electrode can be provided at a region on the main surface of the semiconductor chip, so that the semiconductor device can be downsized.

Furthermore, since the conductive portion is provided on the main surface of the semiconductor chip, it is not necessary to ensure a region required to provide the conductive portion in a region other than the region on the semiconductor chip in the two-dimensional layout. Therefore, the semiconductor device can further be downsized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described hereinafter based on the drawings.

First Embodiment

First, a configuration of a semiconductor device of the present embodiment will be described with reference to FIGS. 1-4. It should be noted that a line I-I in each of FIGS. 2 and 3 indicates a position where a cross section in FIG. 1 is taken.

Figure 1:
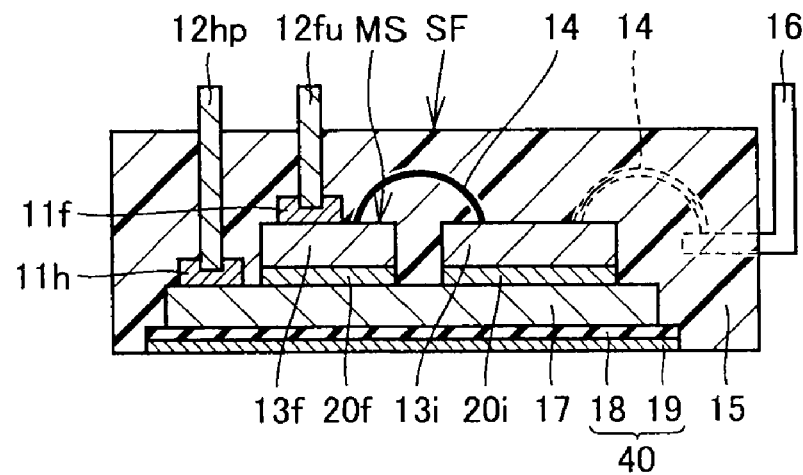
FIG. 1 is a cross-sectional view schematically illustrating a configuration of a semiconductor device in a first embodiment of the present invention.
Figure 2:
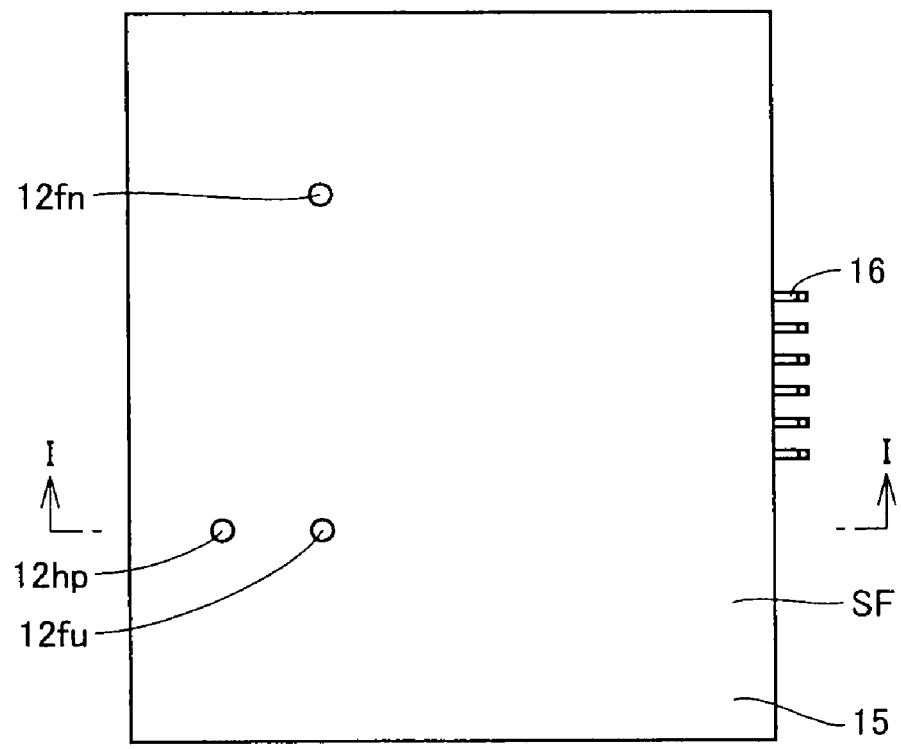
FIG. 2 is a plan view schematically illustrating the configuration of the semiconductor device in the first embodiment of the present invention.
Figure 3:
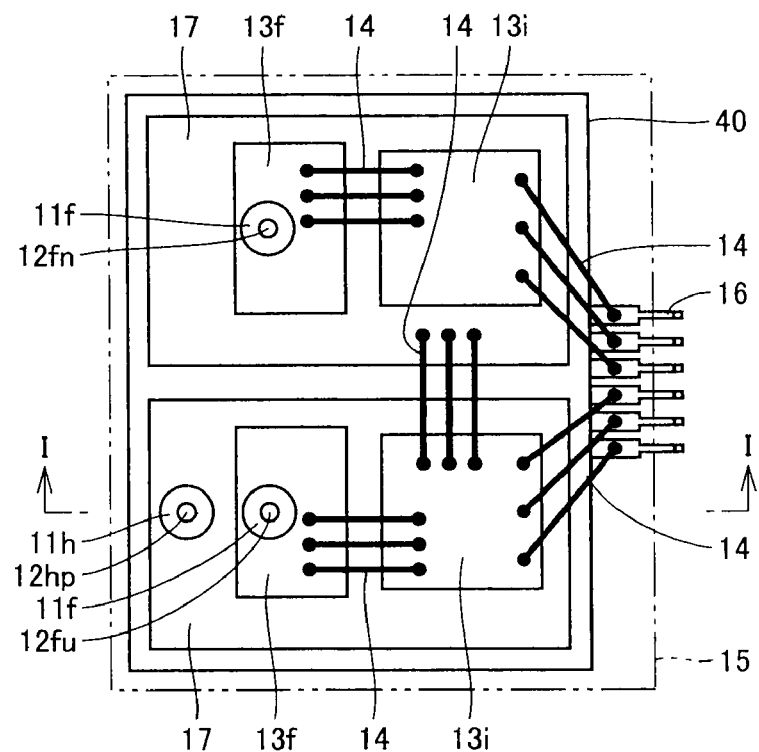
FIG. 3 is a diagram corresponding to FIG. 2 in which a mold resin is not shown.

Referring to FIGS. 1-3, the semiconductor device of the present embodiment is a transfer-mold type power module having a plurality of power devices mounted thereon (embedded therein). This semiconductor device has a plurality of free wheel diodes 13*f* (semiconductor chips), a plurality of IGBTs 13*i*, a plurality of electrode joint solder portions 11*f* (conductive portions), an electrode joint solder portion 11*h*, a mold resin portion 15 (a sealing resin portion), main electrode pins 12*fu* and 12*fn* (electrodes), a main electrode pin 12*hp*, a plurality of wires 14, a plurality of external electrode leads 16, a plurality of heat spreaders 17, a high thermal conductivity insulating sheet 40, a plurality of die bonding solder portions 20*f*, and a plurality of die bonding solder portions 20*i*.

Free wheel diode 13*f* and IGBT 13*i* are power devices and have main surfaces MS (surfaces shown in FIG. 3), respectively. An anode pad of free wheel diode 13*f* as well as an emitter pad and a control pad of IGBT 13*i* that will be described hereinafter are formed on these main surfaces MS.

Electrode joint solder portion 11*f* is provided on main surface MS of free wheel diode 13*f*. Electrode joint solder portion 11*h* is provided on heat spreader 17. These electrode joint solder portions 11*f* and 11*h* are made from solder, that is, a material having conductivity and malleability (plasticity under pressure).

Mold resin portion 15 covers respective main surfaces MS of free wheel diode 13*f* and IGBT 13*i*. Thus, mold resin portion 15 has a surface SF facing main surfaces MS. Mold resin portion 15 is a member containing a resin material. Mold resin portion 15 may further contain a filling material made from an inorganic material. Mold resin portion 15 is preferably made from a material suitable for the transfer molding method. In other words, mold resin portion 15 is preferably made from a material having sufficient fluidity at the time of resin molding.

Main electrode pins 12*fu* and 12*fn* are electrodes corresponding to free wheel diode 13*f* portion, and main electrode pin 12*hp* is an electrode corresponding to heat spreader 17 portion. Main electrode pins 12*fu* and 12*fn* are provided on electrode joint solder portion 11*f* and pass through mold resin portion 15 between electrode joint solder portion 11*f* and surface SF of mold resin portion 15. Main electrode pin 12*hp* is provided on electrode joint solder portion 11*h* and passes through mold resin portion 15 between electrode joint solder portion 11*h* and surface SF of mold resin portion 15.

High thermal conductivity insulating sheet 40 has an insulator portion 18 and copper foil 19. Insulator portion 18 and copper foil 19 are stacked and integrally formed. Insulator portion 18 is made from an insulator having higher thermal conductivity than that of the material of mold resin portion 15. This insulator is, for example, an epoxy resin containing a high thermal conductivity filler. Copper foil 19 has the function of protecting insulator portion 18 as a base material of high thermal conductivity insulating sheet 40. It should be noted that foil made from metal other than copper such as aluminum can also be used instead of copper foil 19.

A wire 14 is a thin metallic wire and made from, for example, aluminum.

Die bonding solder portions 20*f* and 20*i* are provided under free wheel diode 13*f* and IGBT 13*i*, respectively.

Figure 4:
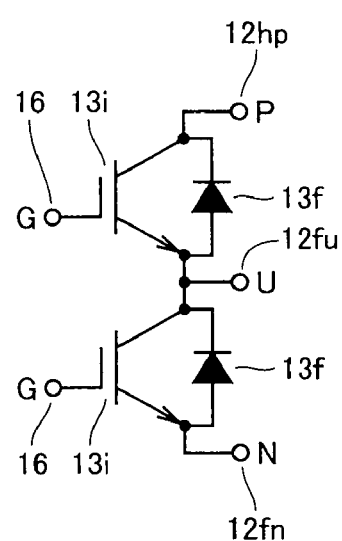
FIG. 4 is a diagram schematically illustrating a circuit configuration of the semiconductor device in the first embodiment of the present invention.

Referring to FIG. 4, each of a pair of IGBTs 13*i* has an emitter terminal and a collector terminal as main terminals that are terminals for input/output of main current. IGBT 13*i* is a semiconductor switching element that switches a current path between the emitter terminal and the collector terminal. The switching is performed in accordance with a control signal applied to a gate G.

The emitter of one IGBT 13*i* and the collector of the other IGBT 13*i* are connected to each other, and this connecting portion corresponds to an output terminal U of the semiconductor device. Furthermore, the collector terminal of one IGBT 13*i* and the emitter terminal of the other IGBT 13*i* correspond to input terminals P and N of the semiconductor device, respectively. In addition, free wheel diode 13*f* is connected in anti-parallel to each IGBT 13*i*. With this configuration, an output in accordance with the control signal can be obtained from output terminal U by applying a control signal to each gate G with a direct current high voltage being applied across input terminals P and N such that a potential of input terminal P becomes higher than that of input terminal N.

Referring to FIGS. 1-4, each IGBT 13*i* has the control pad (not shown) corresponding to gate G. This control pad is connected to external electrode lead 16 by wire 14. Each IGBT 13*i* also has the emitter pad (not shown) for connection of wire 14. Furthermore, a collector (a rear electrode) of each IGBT 13*i* is connected to heat spreader 17 by die bonding solder portion 20*i*.

Each free wheel diode 13*f* has the anode pad (not shown) on one side (a side shown in FIG. 3). This anode pad is connected to IGBT 13*i* by wire 14. Electrode joint solder portion 11*f* is arranged on the anode pad. The other side (a side opposite to the side shown in FIG. 3) of each free wheel diode 13*f* serves as a cathode and is connected to heat spreader 17 by die bonding solder portion 20*f*.

Referring to FIGS. 1-3, main electrode pins 12*hp*, 12*fu* and 12*fn* protrude from the inside of mold resin portion 15 through surface SF to the outside of mold resin portion 15. Furthermore, main electrode pins 12*fu* and 12*fn* are electrically connected to electrode joint solder portion 11*f* inside mold resin portion 15. Main electrode pin 12*hp* is electrically connected to electrode joint solder portion 11*h* inside mold resin portion 15.

Heat spreader 17 is provided on a surface opposite to respective main surfaces MS of free wheel diode 13*f* and IGBT 13*i*. Heat spreader 17 is a member made from a material having high conductivity and thermal conductivity, and is, for example, a plate-like member made from copper (Cu) (having a thickness of, for example, 3 mm). Heat spreader 17 has the function as a part of a wiring path and the function of promoting heat radiation by dissipation of heat generated from free wheel diode 13*f* and IGBT 13*i*.

Next, a method of manufacturing the semiconductor device of the present embodiment will be described.

Figure 5:
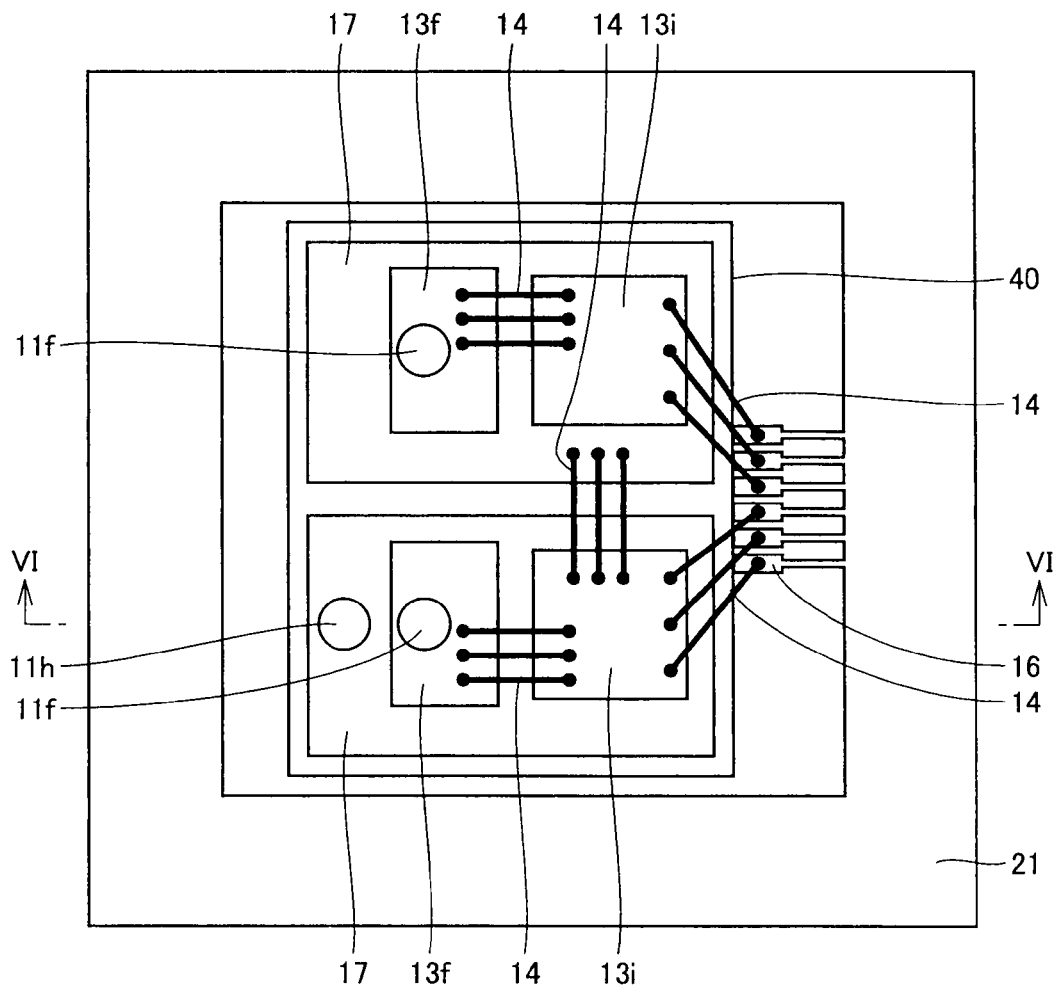
FIG. 5 is a plan view schematically illustrating a first step of a method of manufacturing the semiconductor device in the first embodiment of the present invention.
Figure 6:
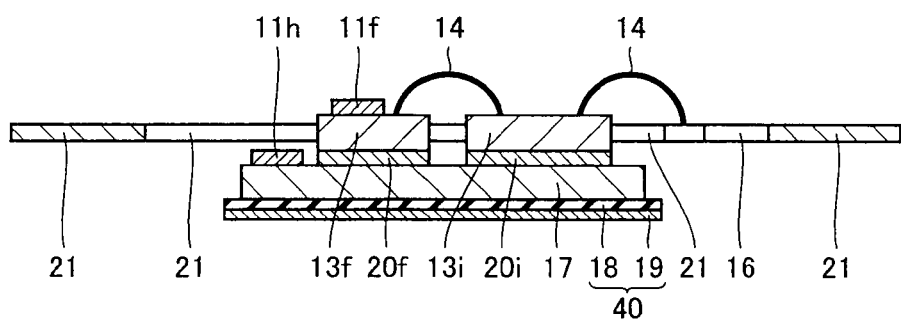
FIGS. 6-9 are cross-sectional views schematically and sequentially illustrating the first to fourth steps of the method of manufacturing the semiconductor device in the first embodiment of the present invention.

Referring mainly to FIGS. 5 and 6, a structure that will be sealed with the resin is formed. Specifically, free wheel diode 13*f* and IGBT 13*i* are first joined to heat spreader 17 with die bonding solder portion 20*f* and die bonding solder portion 20*i* interposed therebetween, respectively. A lead frame 21 having external electrode lead 16 is arranged to surround heat spreader 17. In order to form a circuit shown in FIG. 4, wire bonding by wires 14 is performed among free wheel diode 13*f*, IGBT 13*i*, external electrode lead 16, and heat spreader 17. Then, high thermal conductivity insulating sheet 40 is placed on the underside of heat spreader 17. Furthermore, electrode joint solder portion 11*f* and electrode joint solder portion 11*h* are formed on main surface MS of free wheel diode 13*f* and main surface MS of heat spreader 17, respectively.

Figure 7:
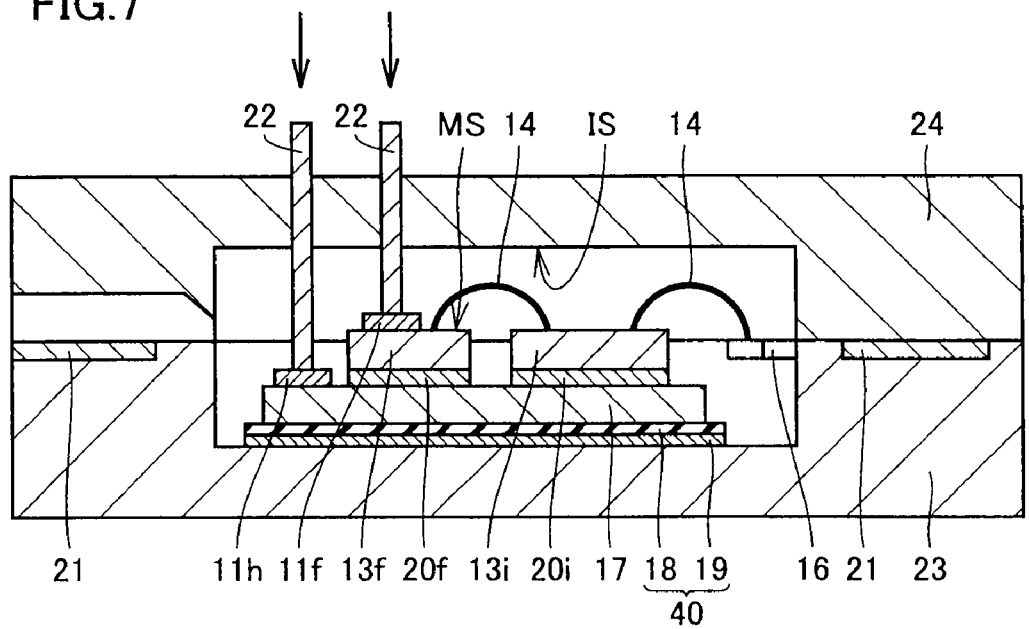

Referring to FIG. 7, a lower die 23 and an upper die 24 for the transfer molding method are prepared. Upper die 24 has a plurality of through holes located at positions corresponding to electrode joint solder portions 11*f* and 11*h* and leading to an inner surface IS of a cavity, as well as pressing pins 22 inserted into these plurality of through holes, respectively. The depth of insertion of pressing pin 22 into the through hole can be controlled by a well-known actuator (not shown). With this configuration, upper die 24 is configured to allow pressing pin 22 to protrude from inner surface IS.

Lower die 23 and upper die 24 are heated. Lead frame 21 is sandwiched between lower die 23 and upper die 24 such that inner surface IS of upper die 24 faces main surface MS of free wheel diode 13f with a spacing therebetween. The plurality of pressing pins 22 protruding from inner surface IS of upper die 24 are pressed against electrode joint solder portion 11f and electrode joint solder portion 11h, respectively, as shown by arrows in FIG. 7. The pressure of this pressing is controlled by the foregoing actuator.

Figure 8:
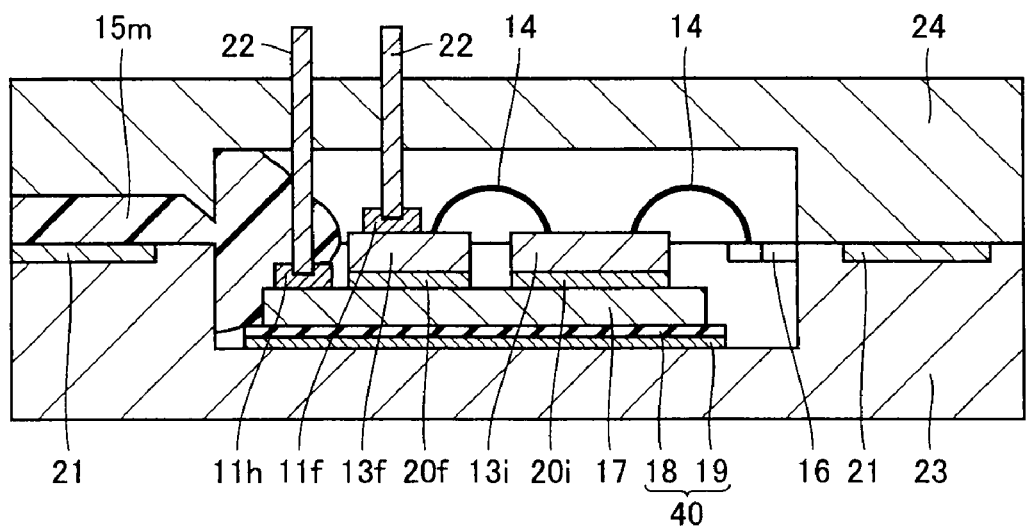

Referring to FIG. 8, since electrode joint solder portion 11f and electrode joint solder portion 11h have malleability, recesses corresponding to the shape of the tips of pressing pins 22 are formed in electrode joint solder portion 11f and electrode joint solder portion 11h, respectively, as a result of pressing by pressing pins 22.

Powder or a tablet mainly composed of an epoxy resin and a filler is melted by heating and pressurization to form a molten material 15m having low viscosity. The cavity is filled with this molten material 15m, which is cured subsequently. Lower die 23 and upper die 24 having pressing pins 22 are removed.

Figure 9:
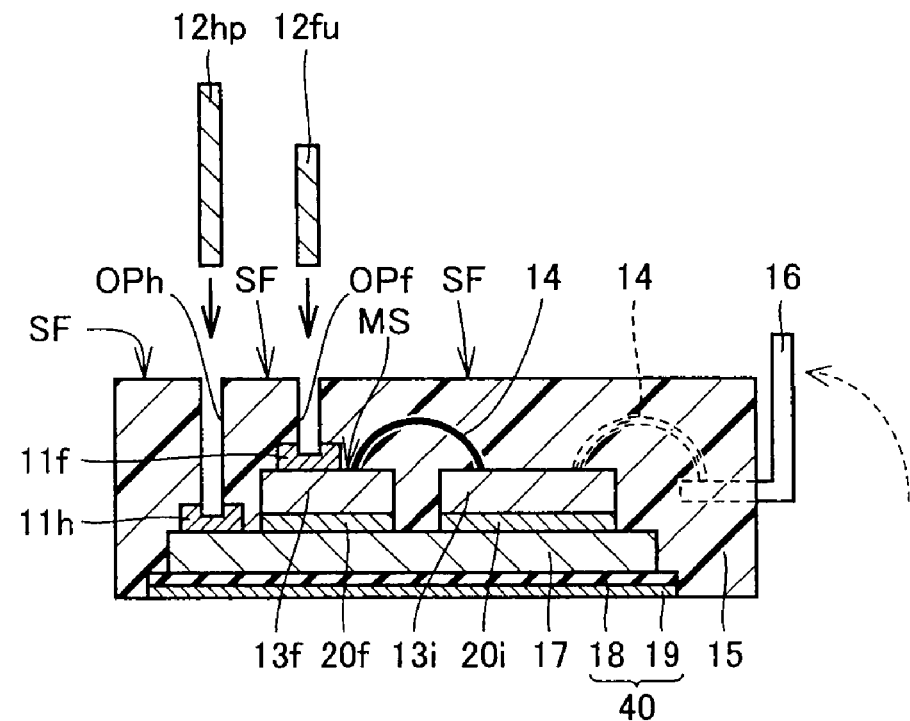

Referring mainly to FIG. 9, mold resin portion 15 having surface SF as well as openings OPf and OPh is formed.

After mold resin portion 15 is formed in such a manner, main electrode pin 12hp as well as main electrode pins 12fu and 12fn (12fn is not shown in FIG. 9) are inserted into opening OPh and openings OPf, respectively, as shown by solid arrows in FIG. 9. As a result, main electrode pins 12fu and 12fn (12fn is not shown in FIG. 9) as well as main electrode pin 12hp are arranged in the recesses in electrode joint solder portions 11f and the recess in electrode joint solder portion 11h, respectively. Next, main electrode pins 12fu and 12fn (12fn is not shown in FIG. 9) as well as main electrode pin 12hp are joined to electrode joint solder portions 11f and electrode joint solder portion 11h, respectively. As the joining method, any of a method by heating, a method by using ultrasonic waves and a pressure bonding method can be used, for example.

Lead frame 21 other than a portion that will form external electrode leads 16 is removed by cutting. Then, external electrode leads 16 are bent toward surface SF side as shown by a dashed arrow in FIG. 9.

The semiconductor device of the present embodiment is obtained with the above-described method.

Figure 10:
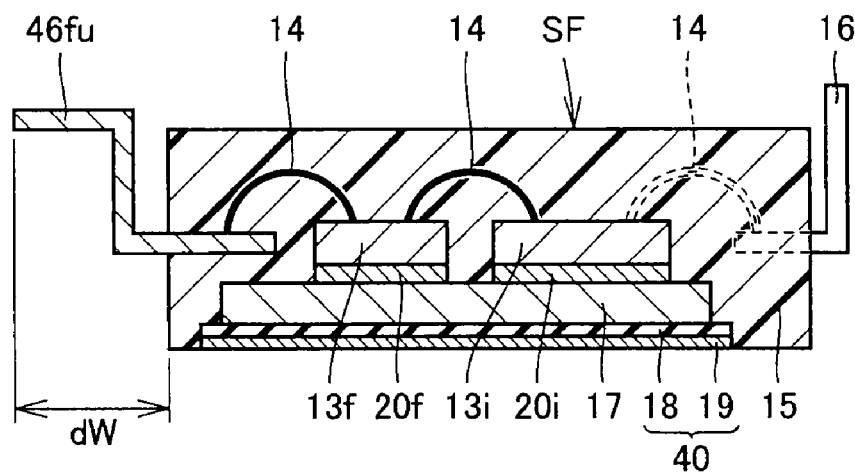
FIG. 10 is a cross-sectional view schematically illustrating a configuration of a semiconductor device in a comparative example.

Referring to FIG. 10, in a comparative example, a semiconductor device has an external main electrode lead 46fu instead of main electrode pin 12fu. External main electrode lead 46fu projects to the outside of mold resin portion 15 from the side located adjacent to surface SF, not from surface SF of mold resin portion 15. As a result of this projection, the semiconductor device in the comparative example has a larger width dimension (a dimension in a lateral direction in FIG. 10) by a dimension dW than that of the semiconductor device of the present embodiment.

According to the present embodiment, as shown in FIG. 1, main electrode pin 12fu can be provided at a region on main surface MS of free wheel diode 13f, so that the semiconductor device can be downsized.

Furthermore, since electrode joint solder portion 11f is provided on main surface MS of free wheel diode 13f, it is not necessary to ensure a region required to provide electrode joint solder portion 11f in a region other than the region on free wheel diode 13f in the two-dimensional layout. Therefore, the semiconductor device can further be downsized.

In addition, electrode joint solder portion 11f has malleability. Therefore, as shown in FIG. 8, when pressing pin 22 is pressed against electrode joint solder portion 11f, electrode joint solder portion 11f is deformed as a result of this pressing and destruction of free wheel diode 13f due to force from pressing pin 22 can be prevented. It should be noted that a conductive resin other than solder, for example, can be used as a material having sufficient malleability and conductivity.

As shown in FIG. 9, main electrode pin 12fu is arranged in the recess of electrode joint solder portion 11f and then joined to electrode joint solder portion 11f. As a result, more reliable joint can be achieved.

Furthermore, as shown in FIG. 1, main electrode pin 12fu is connected to free wheel diode 13f without wire 14, so that the number of required wires 14 can be reduced.

Although main electrode pins 12fu and 12fn are provided on main surface MS of free wheel diode 13f in the present embodiment, the present invention is not limited thereto. The main electrode pins may be provided on, for example, main surface MS of IGBT 13i.

Furthermore, although one main electrode pin is used for one semiconductor chip (at one point), a plurality of main electrode pins may be used in accordance with an amount of current flowing through a main electrode, and the main electrode pin may have a plate-like shape instead of a rod-like shape.

In addition, instead of the configuration where main electrode pins 12fu, 12fn and 12hp are provided in the semiconductor device, a configuration where electrodes to be inserted into openings OPf and OPh (in FIG. 9), respectively, are provided on the external circuit side connected to this semiconductor device can also be used.

Second Embodiment

Figure 11:
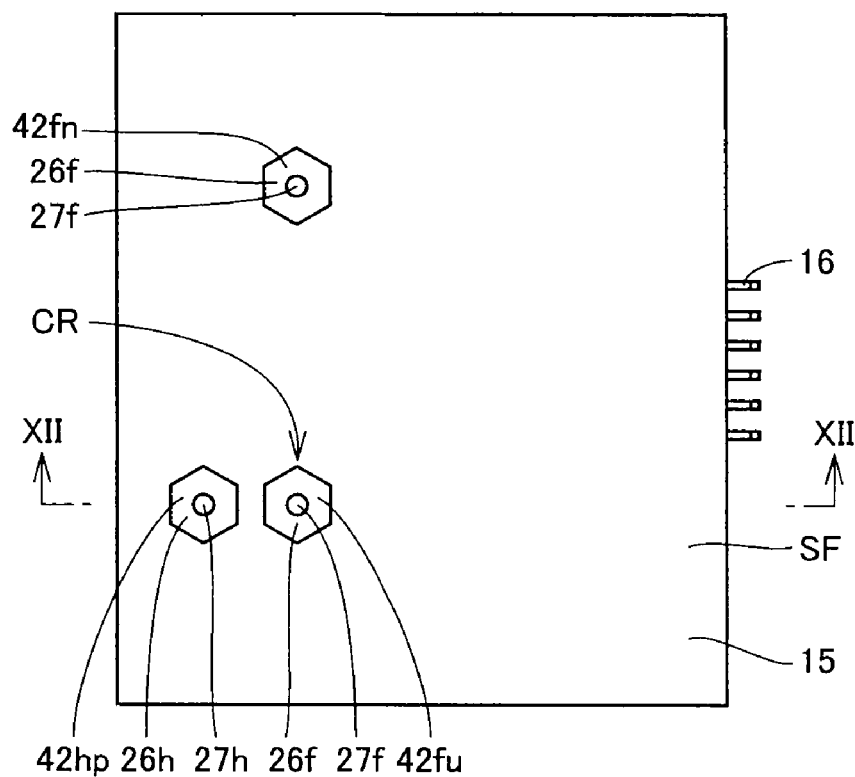
FIG. 11 is a plan view schematically illustrating a configuration of a semiconductor device in a second embodiment of the present invention.
Figure 12:
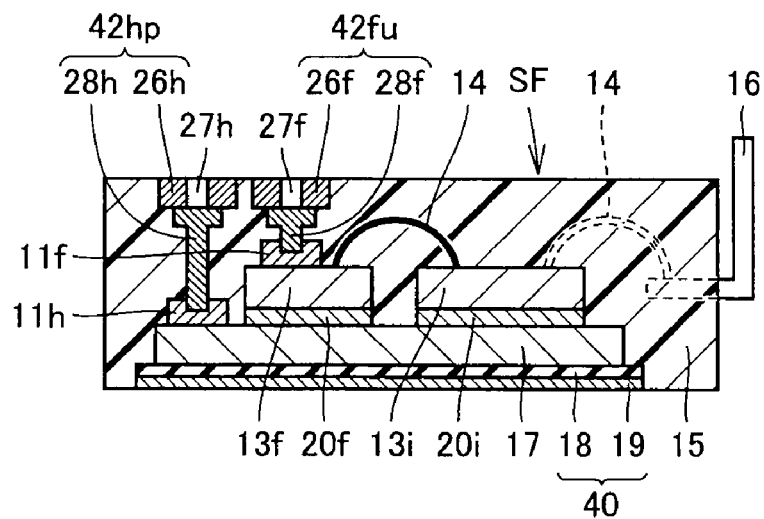
FIG. 12 is a cross-sectional view taken along line XII-XII in FIG. 11.

Referring mainly to FIGS. 11 and 12, a semiconductor device of the present embodiment has main electrode portions 42fu, 42fn and 42hp instead of main electrode pins 12fu, 12fn and 12hp in the first embodiment, respectively. Each of main electrode portions 42fu and 42fn has a pin portion 28f and a rotation suppressing portion 26f. Main electrode portion 42hp has a pin portion 28h and a rotation suppressing portion 26h. Rotation suppressing portions 26f and 26h have screw holes 27f and 27h, respectively. Screw holes 27f and 27h are arranged to be exposed at surface SF.

Each of rotation suppressing portions 26f and 26h has a nut-like shape. As a result, each of rotation suppressing portions 26f and 26h has a corner portion CR protruding in a direction (in an in-plane direction in FIG. 11) transverse to a direction in which screw holes 27f and 27h extend in mold resin portion 15 (in a vertical direction in FIG. 12). Each of rotation suppressing portions 26f and 26h preferably has a plurality of corner portions CR. For example, each of rotation suppressing portions 26f and 26h is configured to have a hexagonal shape as shown in FIG. 11, and has six corner portions CR.

It should be noted that the configuration is otherwise almost the same as that of the above-described first embodiment. Therefore, the same or corresponding elements are represented by the same reference characters, and the description thereof will not be repeated. A manufacturing method is also almost the same except that pressing pins 22 (upper die 24) in the first embodiment need to be shaped in conformity with main electrode portions 42fu, 42fn and 42hp in the present embodiment.

According to the present embodiment, connection between the semiconductor device and a circuit to be connected to the semiconductor device can be achieved by tightening screws in respective screw holes 27f and 27h of rotation suppressing portions 26f and 26h.

Preferably, each of rotation suppressing portions 26f and 26h has the plurality of corner portions CR. As a result, unnecessary rotation of rotation suppressing portions 26f and 26h at the time of tightening the screws can be suppressed. In addition, damage to the mold resin due to concentration of force at the time of tightening the screws is also avoided.

Third Embodiment

Figure 13:
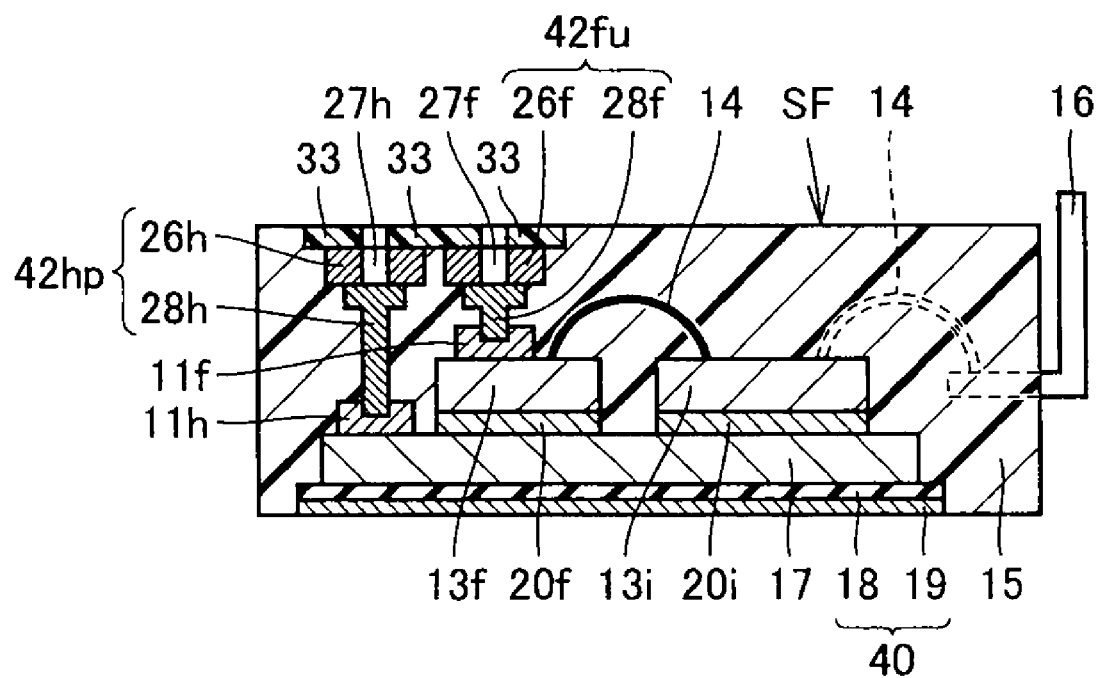
FIG. 13 is a cross-sectional view schematically illustrating a configuration of a semiconductor device in a third embodiment of the present invention.

Referring to FIG. 13, a semiconductor device of the present embodiment has a resin portion 33 fixed to mold resin portion 15, around each of screw holes 27f and 27h exposed at surface SF. Resin portion 33 can be formed by applying and then curing a liquid resin. Instead of the application of the liquid resin, resin portion 33 can also be formed, for example, by bonding a lid (stopper) having through holes corresponding to screw holes 27f and 27h.

It should be noted that the configuration is otherwise almost the same as that of the above-described second embodiment. Therefore, the same or corresponding elements are represented by the same reference characters, and the description thereof will not be repeated.

According to the present embodiment, more sufficient creepage distance between main electrode portions 42fu and 42fn adjoining each other or between main electrode portions 42fu and 42hp adjoining each other can be ensured by resin portion 33. It should be noted that the creepage distance refers to the shortest distance between two conductive portions along the surface of an insulator.

Furthermore, rotation suppressing portions 26f and 26h can be fixed by resin portion 33.

Although the configuration where the electrode is provided on free wheel diode 13f with electrode joint solder portion 11f interposed therebetween is used in the above-described first to third embodiments, the present invention is not limited thereto. For example, a configuration where the electrode is provided on IGBT 13i with the electrode joint solder portion interposed therebetween can also be used.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device, comprising:
a semiconductor chip having a main surface;
a conductive portion provided on said main surface and made from a material having conductivity and malleability;
a sealing resin portion having a surface facing said main surface; and
an electrode provided on said conductive portion and passing through said sealing resin portion between said conductive portion and said surface of the sealing resin portion,
wherein said electrode includes a screw hole exposed at said surface of the sealing resin portion and a corner portion protruding in a direction transverse to a direction in which said screw hole extends in said sealing resin portion.

2. The semiconductor device according to claim 1, wherein the material of said conductive portion includes at least one material selected from the group consisting of solder and a conductive resin.

3. The semiconductor device according to claim 1, further comprising
a fixed resin portion fixed to said sealing resin portion, around said screw hole.

4. The semiconductor device according to claim 1, wherein the conductive portion includes a recessed portion, and an end of the electrode is disposed in the recessed portion.

5. The semiconductor device according to claim 1, wherein the semiconductor chip comprises at least one of a free wheel diode and an insulated gate bipolar transistor.

6. The semiconductor device according to claim 1, wherein the electrode includes a rotation suppressing portion and the screw hole is located on the rotation suppressing portion.

7. The semiconductor device according to claim 6, wherein the corner portion is located on the rotation suppressing portion and the rotation suppressing portion includes at least two other corner portions protruding in a direction transverse to a direction in which said screw hole extends in said sealing resin portion.

8. The semiconductor device according to claim 1, further comprising a heat spreader attached to a surface opposite of the main surface of the semiconductor chip, the heat spreader comprises a thermal conductive material.

9. The semiconductor device according to claim 8, further comprising:
a second conductive portion provided on a main surface of the heat spreader and made from a material having conductivity and malleability; and
a second electrode provided on the second conductive portion,
wherein the sealing resin portion covers the second conductive portion and the second electrode passes through the sealing resin portion to the surface of the sealing resin portion.

10. A semiconductor device, comprising:
a semiconductor chip having a main surface;
a conductive portion provided on said main surface and made from a material having conductivity and malleability;
a sealing resin portion having a surface facing said main surface; and
an electrode provided on said conductive portion and passing through said sealing resin portion between said conductive portion and said surface of the sealing resin portion,
wherein the conductive portion includes a recessed portion, and an end of the electrode is disposed in the recessed portion.

11. The semiconductor device according to claim 10, wherein
the material of said conductive portion includes at least one material selected from the group consisting of solder and a conductive resin.

12. The semiconductor device according to claim 10, wherein said electrode includes a screw hole exposed at said surface of the sealing resin portion and a corner portion protruding in a direction transverse to a direction in which said screw hole extends in said sealing resin portion.

13. The semiconductor device according to claim 12, further comprising
a fixed resin portion fixed to said sealing resin portion, around said screw hole.

14. The semiconductor device according to claim 12, wherein the electrode includes a rotation suppressing portion and the screw hole is located on the rotation suppressing portion.

15. The semiconductor device according to claim 14, wherein the corner portion is located on the rotation suppressing portion and the rotation suppressing portion includes at least two other corner portions protruding in a direction transverse to a direction in which said screw hole extends in said sealing resin portion.

16. The semiconductor device according to claim 10, wherein the semiconductor chip comprises at least one of a free wheel diode and an insulated gate bipolar transistor.

17. The semiconductor device according to claim 10, further comprising a heat spreader attached to a surface opposite of the main surface of the semiconductor chip, the heat spreader comprises a thermal conductive material.

18. The semiconductor device according to claim 17, further comprising:
   a second conductive portion provided on a main surface of the heat spreader and made from a material having conductivity and malleability; and
   a second electrode provided on the second conductive portion,
   wherein the sealing resin portion covers the second conductive portion and the second electrode passes through the sealing resin portion to the surface of the sealing resin portion.

* * * * *